(12) United States Patent
Bolken

(10) Patent No.: US 7,220,615 B2
(45) Date of Patent: *May 22, 2007

(54) ALTERNATIVE METHOD USED TO PACKAGE MULTIMEDIA CARD BY TRANSFER MOLDING

(75) Inventor: Todd O. Bolken, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 750 days.

This patent is subject to a terminal disclaimer.

(21) Appl. No.: 09/878,302

(22) Filed: Jun. 11, 2001

(65) Prior Publication Data

US 2002/0186549 A1 Dec. 12, 2002

(51) Int. Cl.
*H01L 21/66* (2006.01)
*H01L 21/00* (2006.01)
*H01L 21/44* (2006.01)
*H05K 1/14* (2006.01)
*H05K 5/00* (2006.01)

(52) U.S. Cl. .......................... 438/106; 438/15; 438/25; 438/26; 438/51; 438/55; 361/736; 361/752; 361/816; 361/737; 257/666; 257/679

(58) Field of Classification Search ............... 438/15, 438/25, 26, 51, 55, 106, 125, 64; 361/736, 361/752, 816, 737, 758, 818; 257/666, 679
See application file for complete search history.

(56) References Cited

U.S. PATENT DOCUMENTS

| | | |
|---|---|---|
| 3,930,114 A | 12/1975 | Hodge |
| 4,305,897 A | 12/1981 | Hazama et al. |
| 4,494,659 A | 1/1985 | Spees |
| 4,554,126 A | 11/1985 | Sera |
| 4,779,835 A | 10/1988 | Fukushima et al. |
| 4,781,804 A | 11/1988 | Wolf |
| 4,800,178 A | 1/1989 | Mathew et al. |

(Continued)

FOREIGN PATENT DOCUMENTS

| | | |
|---|---|---|
| EP | 0 254 444 A1 | 1/1988 |
| JP | 54049069 A | 4/1979 |
| JP | 55091838 | 9/1980 |
| JP | 55-128835 | 10/1980 |
| JP | 56-133857 | 10/1981 |
| JP | 56-4241 | 1/1987 |
| JP | 62-109326 | 5/1987 |
| JP | 62-115834 | 5/1987 |
| JP | 62-261133 | 11/1987 |
| JP | 2-306639 | 12/1990 |
| JP | 4184944 | 4/1992 |
| JP | 06132336 A | 5/1994 |
| JP | 6-151492 | 5/1994 |
| JP | 7-171786 * | 7/1995 |
| JP | 07324198 A | 12/1995 |
| JP | 07324199 A | 12/1995 |
| JP | 09050977 A | 2/1997 |
| JP | 09162210 A | 6/1997 |
| JP | 11097470 A | 4/1999 |

*Primary Examiner*—Carl Whitehead, Jr.
*Assistant Examiner*—James M. Mitchell
(74) *Attorney, Agent, or Firm*—TraskBritt, PC

(57) ABSTRACT

A semiconductor card is made by a disclosed method which, in one molding step, forms a plastic body on a substrate attached to a surrounding frame by narrow connecting segments spanning a peripheral opening. The connecting segments are motivated downward by pins outside of the card periphery, holding the substrate against a lower level of the mold cavity during molding. Molded wings extending laterally from the card periphery are also formed. Following molding and curing, the casting is removed and the card singulated by excising the wings from the card. The resulting card has smooth edge surfaces and precise dimensions. Separate glob top encapsulation is avoided.

8 Claims, 13 Drawing Sheets

U.S. PATENT DOCUMENTS

| | | | |
|---|---|---|---|
| 4,818,204 A | 4/1989 | Nakagawa et al. | |
| 4,862,245 A | 8/1989 | Pashby et al. | |
| 4,900,485 A | 2/1990 | Murakami | |
| 4,908,178 A | 3/1990 | Nakagawa et al. | |
| 4,910,582 A * | 3/1990 | Miyamoto et al. | 257/667 |
| 4,954,308 A | 9/1990 | Yabe et al. | |
| 4,966,664 A | 10/1990 | Buerk et al. | |
| 4,968,397 A | 11/1990 | Asher et al. | |
| 4,968,398 A | 11/1990 | Ogasawara | |
| 4,984,059 A | 1/1991 | Kubota et al. | |
| 5,028,741 A | 7/1991 | Sanders et al. | |
| 5,041,902 A | 8/1991 | McShane | |
| 5,071,334 A | 12/1991 | Ohara | |
| 5,074,779 A | 12/1991 | Tsutsumi et al. | |
| 5,079,673 A | 1/1992 | Kodai et al. | |
| 5,108,955 A | 4/1992 | Ishida et al. | |
| 5,122,860 A | 6/1992 | Kikuchi et al. | |
| 5,173,840 A | 12/1992 | Kodai et al. | |
| 5,173,841 A | 12/1992 | Uenaka et al. | |
| 5,184,208 A | 2/1993 | Sakuta et al. | |
| 5,186,797 A | 2/1993 | Schlenker et al. | |
| RE34,227 E | 4/1993 | Asher et al. | |
| 5,200,362 A | 4/1993 | Lin et al. | |
| 5,218,759 A | 6/1993 | Juskey et al. | |
| 5,252,853 A | 10/1993 | Michii | |
| 5,286,679 A | 2/1994 | Farnworth et al. | |
| 5,293,072 A | 3/1994 | Tsuji et al. | |
| 5,304,842 A | 4/1994 | Farnworth et al. | |
| 5,318,677 A | 6/1994 | Hirbour et al. | |
| 5,344,795 A | 9/1994 | Hashemi et al. | |
| 5,362,370 A | 11/1994 | van der Heijden | |
| 5,366,933 A | 11/1994 | Golwalker et al. | |
| 5,367,196 A | 11/1994 | Mahulikar et al. | |
| 5,369,056 A | 11/1994 | Burns et al. | |
| 5,400,451 A | 3/1995 | Furukawa | |
| 5,416,358 A * | 5/1995 | Ochi et al. | 257/666 |
| 5,427,938 A | 6/1995 | Matsumura et al. | |
| 5,440,169 A | 8/1995 | Tomita et al. | |
| 5,441,684 A | 8/1995 | Lee | |
| 5,442,234 A | 8/1995 | Liang | |
| 5,459,103 A | 10/1995 | Kelleher et al. | |
| 5,461,255 A | 10/1995 | Chan et al. | |
| 5,470,892 A | 11/1995 | Gupta et al. | |
| 5,471,366 A | 11/1995 | Ozawa | |
| 5,471,369 A | 11/1995 | Honda et al. | |
| 5,485,037 A | 1/1996 | Marrs | |
| 5,498,388 A | 3/1996 | Kodai et al. | |
| 5,520,863 A | 5/1996 | Ochi et al. | |
| 5,530,295 A | 6/1996 | Mehr | |
| 5,550,711 A | 8/1996 | Burns et al. | |
| 5,592,735 A | 1/1997 | Ozawa et al. | |
| 5,594,282 A | 1/1997 | Otsuki | |
| 5,596,231 A | 1/1997 | Combs | |
| 5,598,034 A | 1/1997 | Wakefield | |
| 5,604,376 A | 2/1997 | Hamburgen et al. | |
| 5,617,297 A | 4/1997 | Lo et al. | |
| 5,626,887 A | 5/1997 | Chou et al. | |
| 5,637,913 A * | 6/1997 | Kajihara et al. | 257/666 |
| 5,652,461 A | 7/1997 | Ootsuki et al. | |
| 5,675,182 A | 10/1997 | Moscicki | |
| 5,689,137 A | 11/1997 | Weber | |
| 5,693,984 A | 12/1997 | Ootsuki | |
| 5,698,152 A | 12/1997 | Taruno et al. | |
| 5,701,034 A | 12/1997 | Marrs | |
| 5,715,594 A | 2/1998 | Patterson et al. | |
| 5,716,458 A | 2/1998 | Machino | |
| 5,719,442 A | 2/1998 | Otsuki | |
| 5,725,819 A | 3/1998 | Onishi et al. | |
| 5,735,040 A | 4/1998 | Ochi et al. | |
| 5,766,982 A | 6/1998 | Akram et al. | |
| 5,776,407 A | 7/1998 | Takeda | |
| 5,779,958 A | 7/1998 | Nishihara et al. | |
| 5,789,806 A | 8/1998 | Chua et al. | |
| 5,796,160 A | 8/1998 | Kozono | |
| 5,801,074 A | 9/1998 | Kim et al. | |
| 5,807,768 A | 9/1998 | Shin | |
| 5,821,614 A | 10/1998 | Hashimoto et al. | |
| 5,841,192 A | 11/1998 | Exposito | |
| 5,877,545 A | 3/1999 | Prince et al. | |
| 5,877,549 A | 3/1999 | Kim | |
| 5,889,323 A | 3/1999 | Tachibana | |
| 5,891,759 A | 4/1999 | Otsuki | |
| 5,914,531 A | 8/1999 | Tsunda et al. | |
| 5,981,312 A | 11/1999 | Farquhar et al. | |
| 5,986,336 A | 11/1999 | Tomita | |
| 5,998,243 A | 12/1999 | Odashima et al. | |
| 6,001,672 A | 12/1999 | Wensel | |
| 6,002,173 A | 12/1999 | Casati et al. | |
| 6,020,625 A * | 2/2000 | Qin et al. | 257/666 |
| 6,049,463 A | 4/2000 | O'Malley et al. | |
| 6,068,191 A * | 5/2000 | Dlugosch et al. | 235/487 |
| 6,081,978 A | 7/2000 | Utsumi et al. | |
| 6,081,997 A | 7/2000 | Chia et al. | |
| 6,083,775 A * | 7/2000 | Huang et al. | 438/118 |
| 6,107,690 A | 8/2000 | Courtenay et al. | |
| 6,128,195 A | 10/2000 | Weber et al. | |
| 6,159,770 A | 12/2000 | Tetaka et al. | |
| 6,187,912 B1 | 2/2001 | Orcutt | |
| 6,241,153 B1 * | 6/2001 | Tiffany, III | 325/488 |
| 6,242,287 B1 * | 6/2001 | Aoki et al. | 438/111 |
| 6,245,279 B1 | 6/2001 | Kalemba | |
| 6,295,221 B1 | 9/2001 | Iwasaki et al. | |
| 6,308,894 B1 | 10/2001 | Hirai et al. | |
| 6,309,916 B1 | 10/2001 | Crowley et al. | |
| 6,323,064 B1 * | 11/2001 | Lee et al. | 438/117 |
| 6,330,162 B2 | 12/2001 | Sakamoto et al. | |
| 6,365,976 B1 | 4/2002 | Carter | |
| 6,388,984 B2 * | 5/2002 | Kitaura et al. | 369/275.4 |
| 6,404,643 B1 | 6/2002 | Chung | |
| 6,410,355 B1 * | 6/2002 | Wallace | 438/15 |
| 6,439,869 B1 | 8/2002 | Seng et al. | |
| 6,444,501 B1 * | 9/2002 | Bolken | 438/127 |
| 6,462,273 B1 | 10/2002 | Corisis et al. | |
| 6,483,038 B2 * | 11/2002 | Lee et al. | 174/255 |
| RE38,068 E | 4/2003 | Stoll et al. | |
| 6,573,567 B1 | 6/2003 | Nishizawa et al. | |
| 6,753,121 B2 | 6/2003 | Yoneda et al. | |
| 6,592,352 B1 | 7/2003 | Poinelli et al. | |
| 6,603,196 B2 * | 8/2003 | Lee et al. | 257/676 |
| 6,611,048 B1 * | 8/2003 | Fazelpour et al. | 257/670 |
| 6,614,100 B1 | 9/2003 | Hauser et al. | |
| 6,624,005 B1 * | 9/2003 | DiCaprio et al. | 438/113 |
| 6,764,882 B2 * | 7/2004 | Bolken | 438/127 |
| 6,773,247 B1 | 8/2004 | Osada et al. | |
| 6,821,822 B1 * | 11/2004 | Sato | 438/127 |
| 6,838,319 B1 | 1/2005 | Williams | |
| 6,865,431 B1 | 3/2005 | Hirota et al. | |
| RE38,997 E | 2/2006 | Iwasaki | |
| 2001/0008775 A1 | 7/2001 | Yamanoto | |
| 2001/0028544 A1 * | 10/2001 | Sano et al. | 361/301.3 |
| 2001/0050846 A1 | 12/2001 | Cho | |
| 2002/0131251 A1 * | 9/2002 | Corisis et al. | 361/760 |
| 2002/0140068 A1 | 10/2002 | Lee et al. | |
| 2002/0159323 A1 | 10/2002 | Iwasaki | |

* cited by examiner

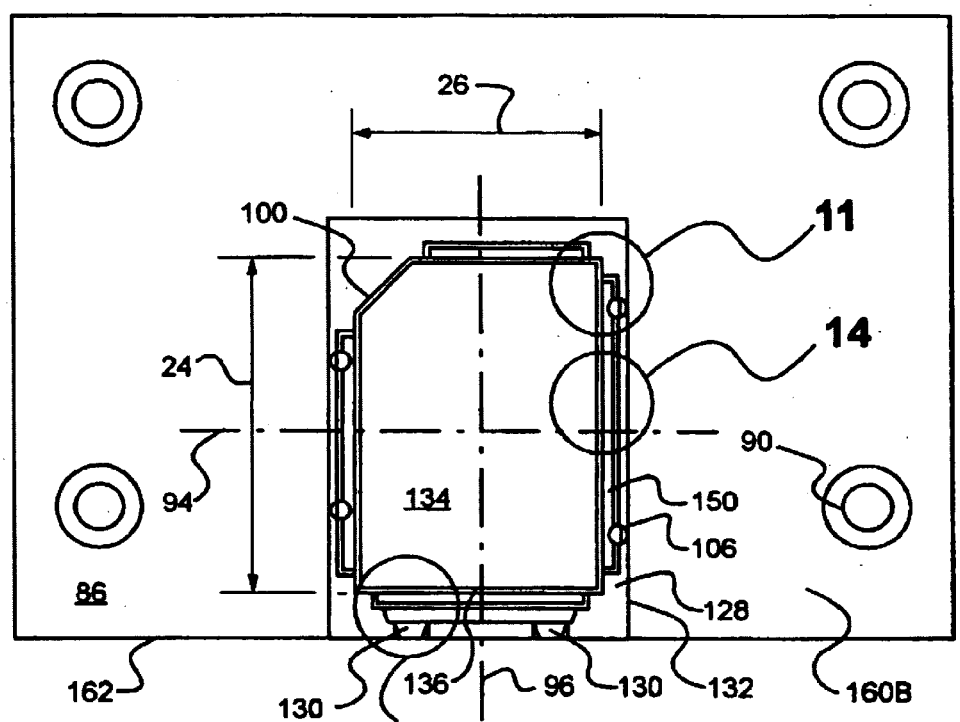
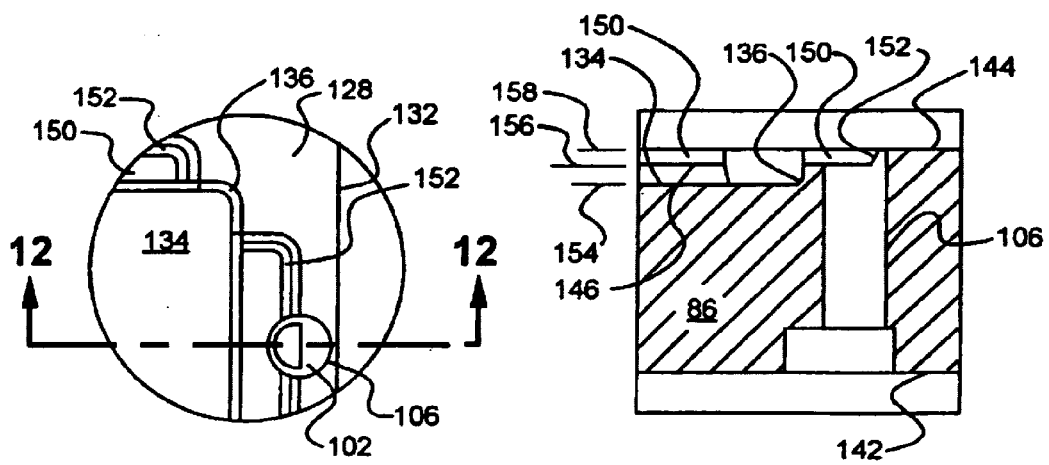
FIG. 10
FIG. 11
FIG. 12

ALTERNATIVE METHOD USED TO PACKAGE MULTIMEDIA CARD BY TRANSFER MOLDING

BACKGROUND OF THE INVENTION

1. Field of the Invention

This invention relates generally to semiconductor manufacture. More particularly, the invention pertains to an improved semiconductor card, and to improved methods and systems for fabricating the card.

2. State of the Art

One type of electronic assembly containing semiconductor components is generally referred to as a "card." Examples of such "cards" include multimedia cards such as used in digital cameras and the like, memory cards, smart cards, and personal computer memory card international association (PCMCIA) cards. The instant patent application refers to these types of cards as "semiconductor cards." These cards are sometimes referred to as "daughter boards."

Typically, a semiconductor card comprises a substrate which may be a thin printed circuit board (PCB) upon which electronic components are mounted. Such components may include, for example, at least one semiconductor die and/or die package as well as resistors, capacitors, inductors and the like to form a desired circuitry. The substrate includes conductors for providing power supply and interconnection of the various components. Typically, the components are mounted on one side, i.e., "circuit" side of the substrate, and are electrically interconnected to external contacts on the opposing side by interlevel conductors. The external contacts are arranged for electrical contact with a next level package, i.e., mother board. In use in an exemplary electronic apparatus, such as a digital camera, the card may be inserted into a slot or other receiver for interconnection with a motherboard, and provide for example, flash memory for digitally recording images.

Semiconductor cards are typically intended for repeated handling by the public, necessitating protection of the components from mechanical forces, moisture, radiation and stray electrical currents. In the industry, the semiconductor components and interconnecting conductors on the circuit side of a card substrate have typically been encapsulated by first applying "glob top" encapsulant. Then, a separately formed protective cover produced by injection molding is adhesively attached over the circuit side of the substrate to form the semiconductor card. However, use of a separately formed cover not only adds undesirable thickness to the card, it requires additional process steps, and is subject to deleterious detachment of the cover from the substrate. In addition, any variation in mounted component height and overlying glob top material will result in card thickness variation.

For most applications, it is desirable to make the card as thin as possible. The use of thin cards saves space within the equipment in which the card is used, as well as storage space, and a saving in encapsulation material is also realized.

A further requirement for semiconductor cards is that the peripheral outlines and card dimensions be as uniform as possible, so that proper effective insertion into a card receiver is assured. Specifications on the peripheral outline and dimensions of semiconductor cards have been set by various industry standard setting bodies, e.g., PCMCIA.

In present methods of manufacture, components for several semiconductor cards are fabricated and wire bonded on a strip of e.g., circuit board. The strip may be viewed as equivalent to the lead frame in die manufacture. The individual cards are then separated from the strip using a singulation process such as sawing. Often the singulation step produces slivers, and forms substrate edges which are rough or sharp. These defects can adversely affect the peripheral outline, dimensions, appearance and use of the card.

The need exists for a method to encapsulate a semiconductor card whereby the card has reduced thickness as well as less variation thereof. In addition, the desired method will produce a card with improved precision in peripheral outline, dimensions and appearance, and at lower cost.

BRIEF SUMMARY OF THE INVENTION

In accordance with the present invention, an improved semiconductor card is provided. In addition, a method and a system for fabricating the improved card are disclosed.

The semiconductor card includes a substrate such as a printed circuit board (PCB). The substrate comprises an electrically insulative material such as an organic polymer resin reinforced with glass fibers, and may include more than one layer. The substrate has a circuit side with a pattern of conductors thereon, and an opposing back side with a pattern of external contacts thereon. Electronic components, such as semiconductor dice, resistors, capacitors, and the like, are formed or mounted on the circuit side of the substrate. The semiconductor dice may comprise bare dice wire bonded to the conductors, bumped dice flip chip mounted to the conductors, or semiconductor packages bonded to the conductors. A single molding step serves to encapsulate the circuit side of the substrate and simultaneously form card surfaces and edges with smooth rounded or oblique corners.

A substrate may be initially formed as a segment of a substrate strip containing more than one module having a substrate separated therefrom by a peripheral opening. The strip is similar in function to a semiconductor lead frame, and permits various fabrication processes to be performed on one or more substrates at the same time. The substrate is connected to the strip with connecting segments similar to tie bars on a semiconductor lead frame.

A molding assembly is adapted to form a plastic body larger than the substrate, and simultaneously encapsulates circuit components, such as dice, resistors, capacitors, bond wires, etc., on the substrate as the card body is formed. Plastic wings are also formed by molding, extending outwardly from a central portion of the card edges along major sides of the card periphery.

Prior to introducing molding compound, a plurality of down-set pins are inserted downward through the upper plate, outside of the card periphery, to depress the connecting segments and attached substrate downward into a cavity. The resulting substrate will be lower than the frame portion of the module, and provide the back side of the semiconductor card.

Following molding, the casting is removed and desingulated by cutting off the wings.

The method is much simpler and quicker than the prior method in which the circuit side of a card is glob topped and then covered by a separately molded cap which is cemented thereto.

BRIEF DESCRIPTION OF THE DRAWINGS

FIG. 10 is an enlarged plan view of the lower side of an upper plate of a molding apparatus for forming a semiconductor card in accordance with the invention;

FIG. 11 is a further enlarged plan view of the lower side of an upper plate of a molding apparatus of the invention, as taken from portion 11 of FIG. 10;

FIG. 12 is a cross-sectional side view of a portion of an upper plate of the invention, as taken along line 12—12 of FIG. 11;

DETAILED DESCRIPTION OF THE INVENTION

Figure 1:
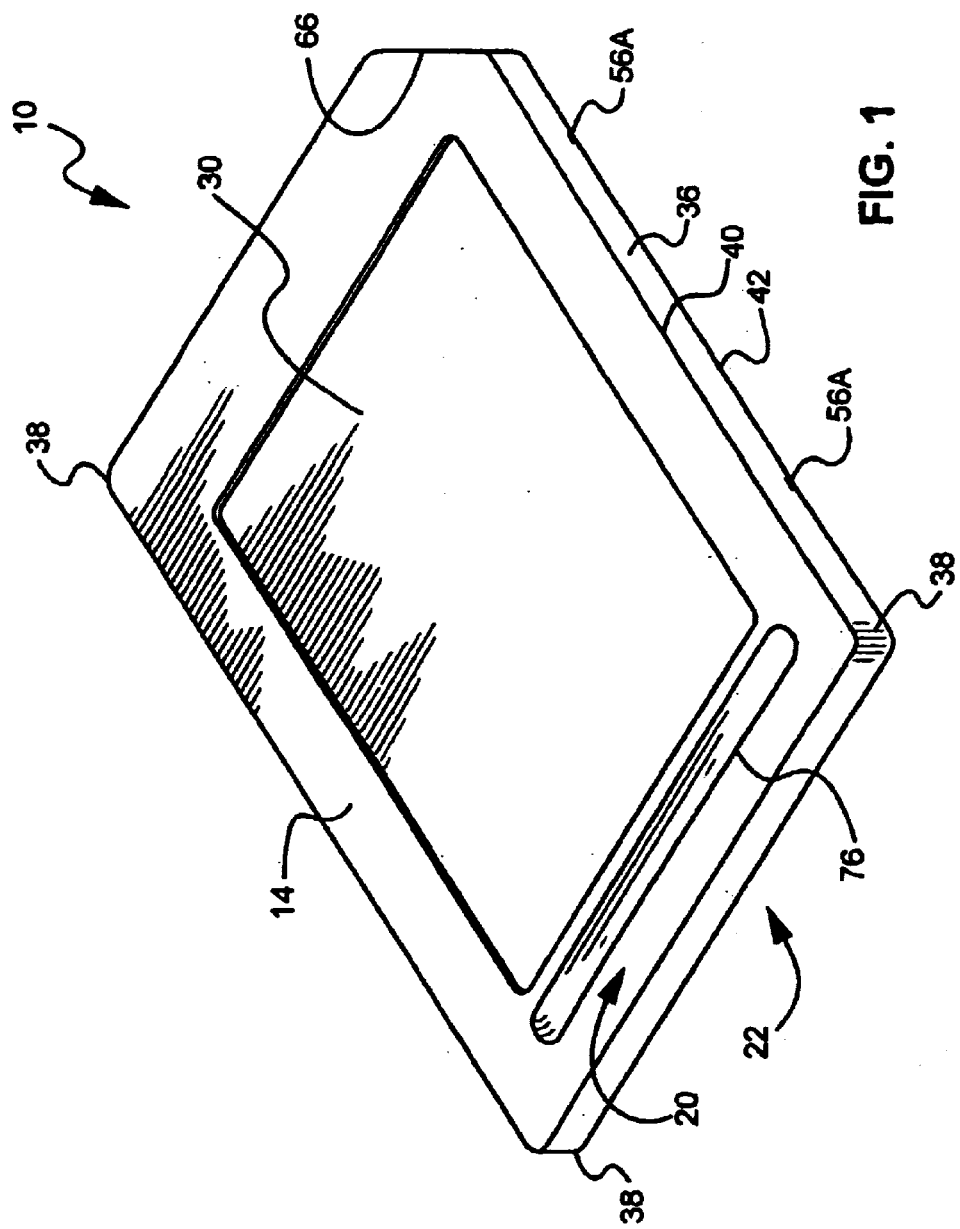
FIG. 1 is an enlarged isometric view of a semiconductor card of the invention.

The invention is described and illustrated herein below in terms of a semiconductor card 10 which is exemplified by a "multimedia card." FIGS. 1 through 4 illustrate an improved semiconductor card 10 constructed in accordance with the invention. The semiconductor card 10 includes a substrate 12 (see FIG. 4) and at least one semiconductor element 16 (see FIG. 4) mounted to the substrate. The semiconductor card 10 also includes a plastic body 14 which is molded to portions of the substrate 12, and an array of external contacts 18 (see FIG. 3) on the substrate 12 for electrical connection with another circuit. Thus, for example, a semiconductor card 10 containing memory (e.g., flash memory) may be configured for removable insertion into photographic devices for digital recording and retrievable storage of still pictures or video, and optionally audio.

Figure 2:
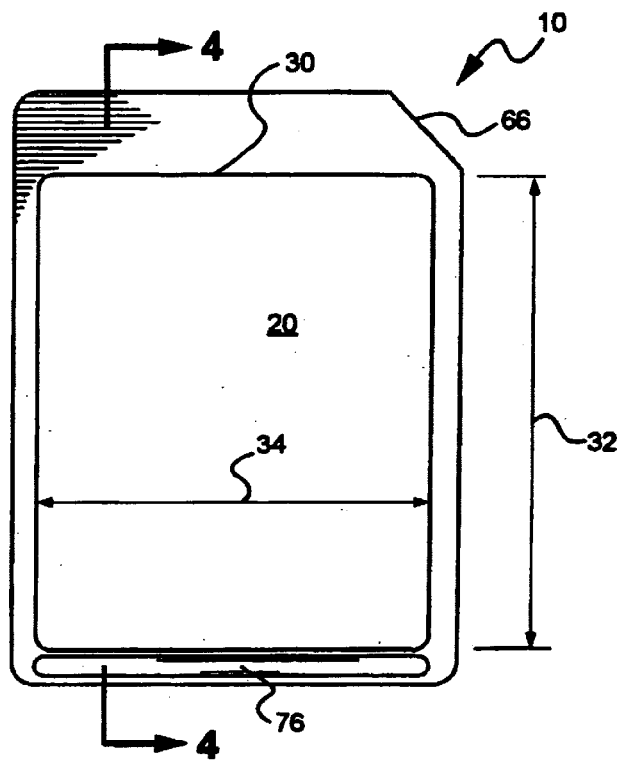
FIG. 2 is an enlarged plan view of a semiconductor card fabricated in accordance with the invention.

As shown in FIGS. 1–4, semiconductor card 10 has a length 24, width 26 and thickness 28. The thickness 28 may typically be set at a desirable value in the range of about 1 mm to about 6 mm. In an exemplary semiconductor card 10 described herein, the length, width, thickness and other aspects of the card may be set by an industry standards group, or alternatively the card configuration is decided by each manufacturer. In the particular example shown, the semiconductor card 10 has a length 24 of about 32 mm, a width 26 of about 24 mm, and a typical thickness 28 of about 1–3 mm. As depicted in FIGS. 1 and 2, the exemplary card may include a slightly depressed label area 30 for attachment or inking of a label (not shown) on the front face 20. The label area 30 is shown with an exemplary height 32 and width 34.

The front face 20 and back face 22 of the semiconductor card 10 are joined by a peripheral edge 36 having rounded corners 38. In accordance with the invention, the longitudinal edge 40 about the front face 20, and the longitudinal edge 42 about the back face 22 are shown as rounded to a radius 21 of e.g., about 0.20 mm for ease of use. See FIG. 4A. As depicted in FIG. 4B, the longitudinal edges 40 and 42 may be alternatively "drafted" by molding an oblique face 23 on the edge.

Figure 4:
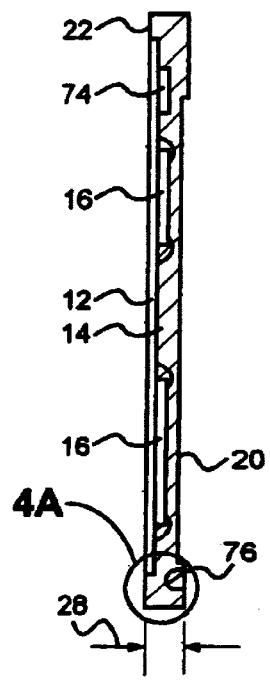
FIG. 4 is an enlarged side cross-sectional view of a semiconductor card fabricated in accordance with the invention, as taken along line 4—4 of FIG. 2.
Figure 3:
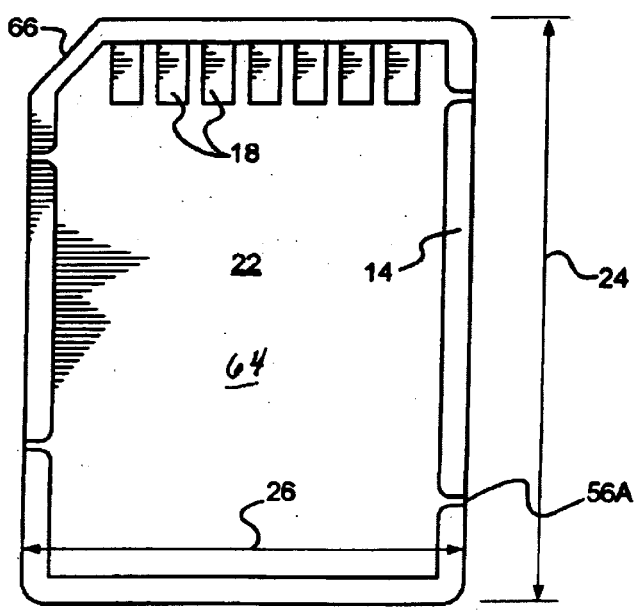
FIG. 3 is an enlarged bottom view of a semiconductor card fabricated in accordance with the invention.
Figure 4A:
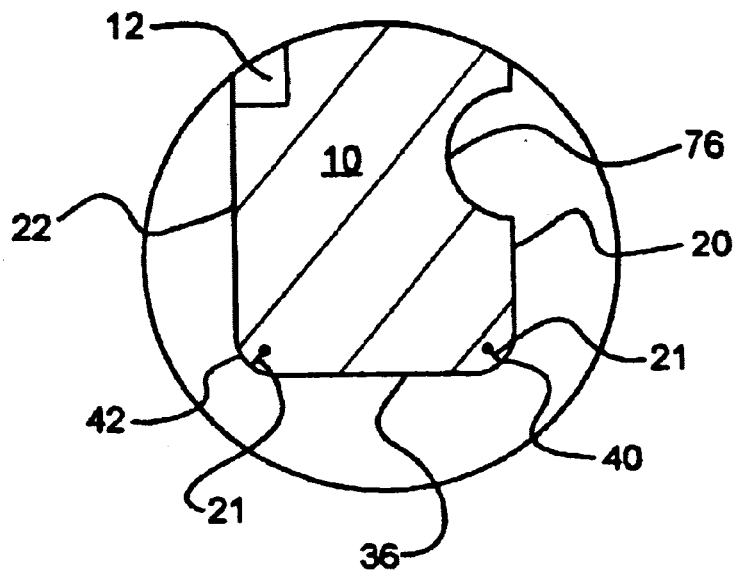
FIG. 4A is an enlarged side cross-sectional view of a portion of a semiconductor card in accordance with the invention, as taken from portion 4A of FIG. 4.
Figure 4B:
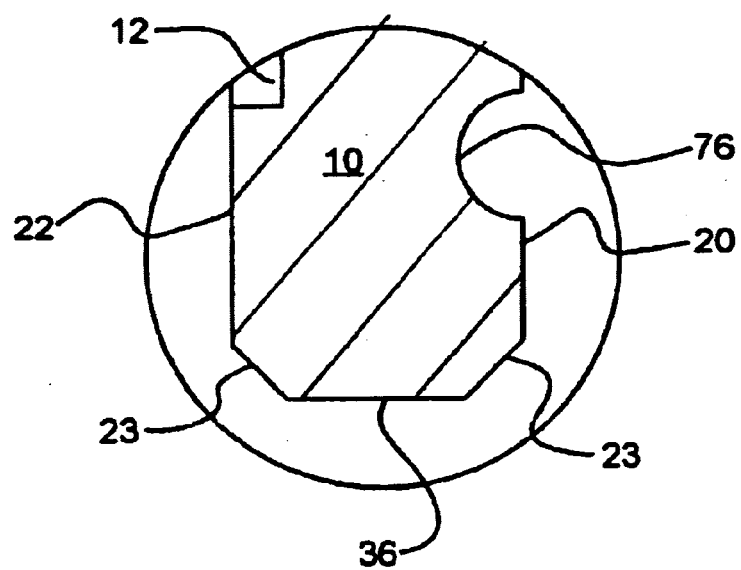
FIG. 4B is an enlarged side cross-sectional view of a portion of a semiconductor card in accordance with the invention, as taken from portion 4B of FIG. 4.

As depicted in FIGS. 1, 2, and 4, a groove 76 is formed in the front face 20, acting as a finger grip for ease of handling.

Figure 5:
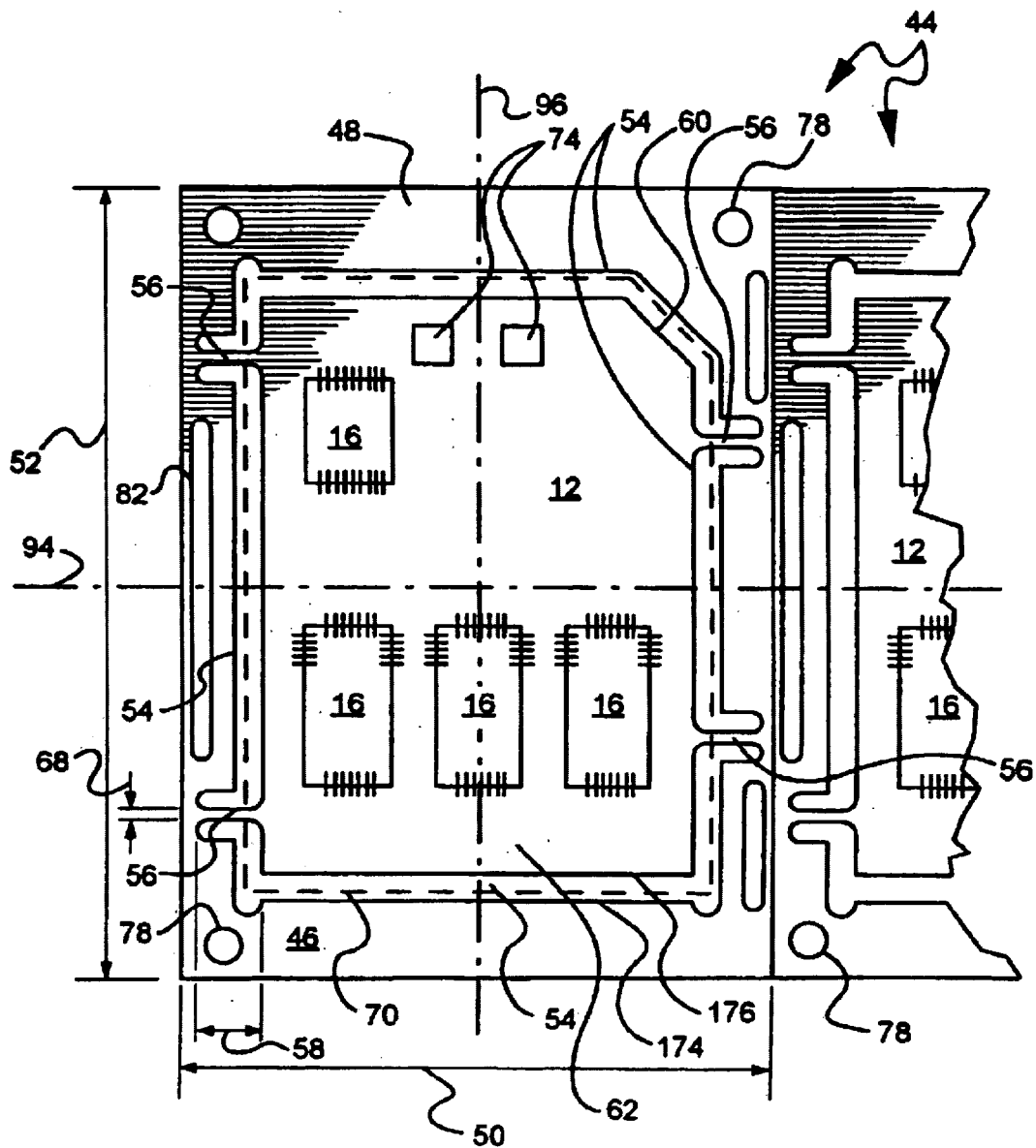
FIG. 5 is an enlarged plan view of a semiconductor card on a strip in accordance with the invention.

In FIG. 5, a module 48 including substrate 12 is depicted as a thin sheet formed of an electrically insulating material, such as an organic polymer resin reinforced with glass fibers. Suitable materials for the module 48 include bismaleimide-triazine (BT), epoxy resins (e.g., "FR-4" and "FR-5"), and polyimide resins. Any of these materials can be formed as a sheet of the desired thickness, and then punched, machined or otherwise formed with a required peripheral configuration and with other desired features. A representative thickness of the sheet of module 48 can be from about 0.2 mm to 1.6 mm. The substrate 12 and surrounding frame 46 together comprise the module 48 having a width 50 and length 52. The module 48 may initially be a segment of a strip 44, which is used to fabricate several semiconductor cards 10 at the same time. One or more substrates 12 may be formed from a strip 44, each substrate being defined by a peripheral opening 54 with inner edge 176 and outer edge 174. Non-substrate portions of the module 48 which surround the substrate 12, are herein denoted as a frame 46. The width of the peripheral opening 54 is configured so that the peripheral outline 70 (hatched line of FIG. 5) of the produced semiconductor card 10 lies within the peripheral opening 54. The substrate 12 is connected to the frame 46 (and supported thereby) by a plurality of connecting segments 56, which are similar to tie bars used in lead frames for semiconductor manufacture. The peripheral opening 54 is shown as extending into the frame 46 on both sides of each connecting segment 56, in order to provide a desired segment length 58. A width 68 of each connecting segment 56 is provided, which supports the substrate 12 during processing. The module 48 containing substrate 12 includes indexing openings 78 for aligning the substrate 12 with a cutting tool, not shown, and a molding apparatus 80 (not shown), described infra. The module 48 may contain other openings 82 (not shown) for other purposes.

As shown in FIG. 5, the peripheral opening 54 may be cut in module 48 to provide substrate 12 with a generally rectangular peripheral shape but with one chamfered corner 60. As shown in FIG. 1, the resulting semiconductor card 10 includes a chamfered corner 66. The purpose of chamfered corner 66 is to generally identify the end of the semiconductor card 10 having external contacts 18, and ensure that a user inserts the card in a proper orientation. However, the invention applies to a semiconductor card 10 or a substrate 12 of any shape. Also shown in FIG. 1 are exposed ends 56A of connecting segments 56 in the as-molded semiconductor card 10 after molding of the plastic body 14 and singulation from the frame 46. See also FIG. 3.

The substrate 12 includes a circuit side 62 (FIG. 5) and an opposing back side 64 (see FIG. 3), which in this embodiment comprises the card's back face 22. In FIG. 5, a longitudinal center line 94 of strip 44, and a longitudinal center line 96 of module 48 are shown for reference. A peripheral edge 72 (not shown) joins the circuit side 62 and the opposing back side 64 of the substrate 12. As illustrated in the exemplary substrate 12 of FIG. 5, the circuit side 62 has mounted therein semiconductor elements 16, as well as electrical components 74, such as resisters, capacitors, and inductors. A circuit is completed by connecting the semiconductor elements 16, electrical components 74 and external contacts 18 (see FIG. 3) with a pattern of conductors, e.g., wires, printed conductors, vias, and the like, not shown in the figures. Contacts (not shown) may also be provided to establish test circuits for example, typically on the circuit side 62 of the substrate. Methods and apparatus for forming, attaching and conductively interconnecting semiconductor elements 16 and electrical components 74 and external contacts 18 are well known in the art. The circuit on the substrate 12 may be configured to perform a desired function, such as, for example, memory storage, sound production, video production, games, product identification, etc.

The external contacts 18 are configured for mating electrical engagement with corresponding contacts (not shown) on a mother board circuit or other electrical assembly (not shown). As illustrated, the external contacts 18 may be planar pads formed of a non-oxidizing conductive material such as gold. However, other configurations for the external contacts 18 may be used, including bumps, pins, or pillars, for example, where the particular application permits.

In other processes for making semiconductor cards 10, semiconductor element 16 and electrical component 74 together with other apparatus on the circuit side 62 are encapsulated with a glob-top material which is cured prior to forming the outer card surfaces. No such encapsulation is utilized in the present invention. As described herein, a method of the invention provides for a single encapsulation step by precise molding that simultaneously encapsulates active semiconductor element 16, and electrical component 74 on the circuit side 62 of the substrate 12 and forms smooth outer surfaces of the semiconductor card 10, including rounded or drafted (angular) peripheral edges 36.

Figure 6:
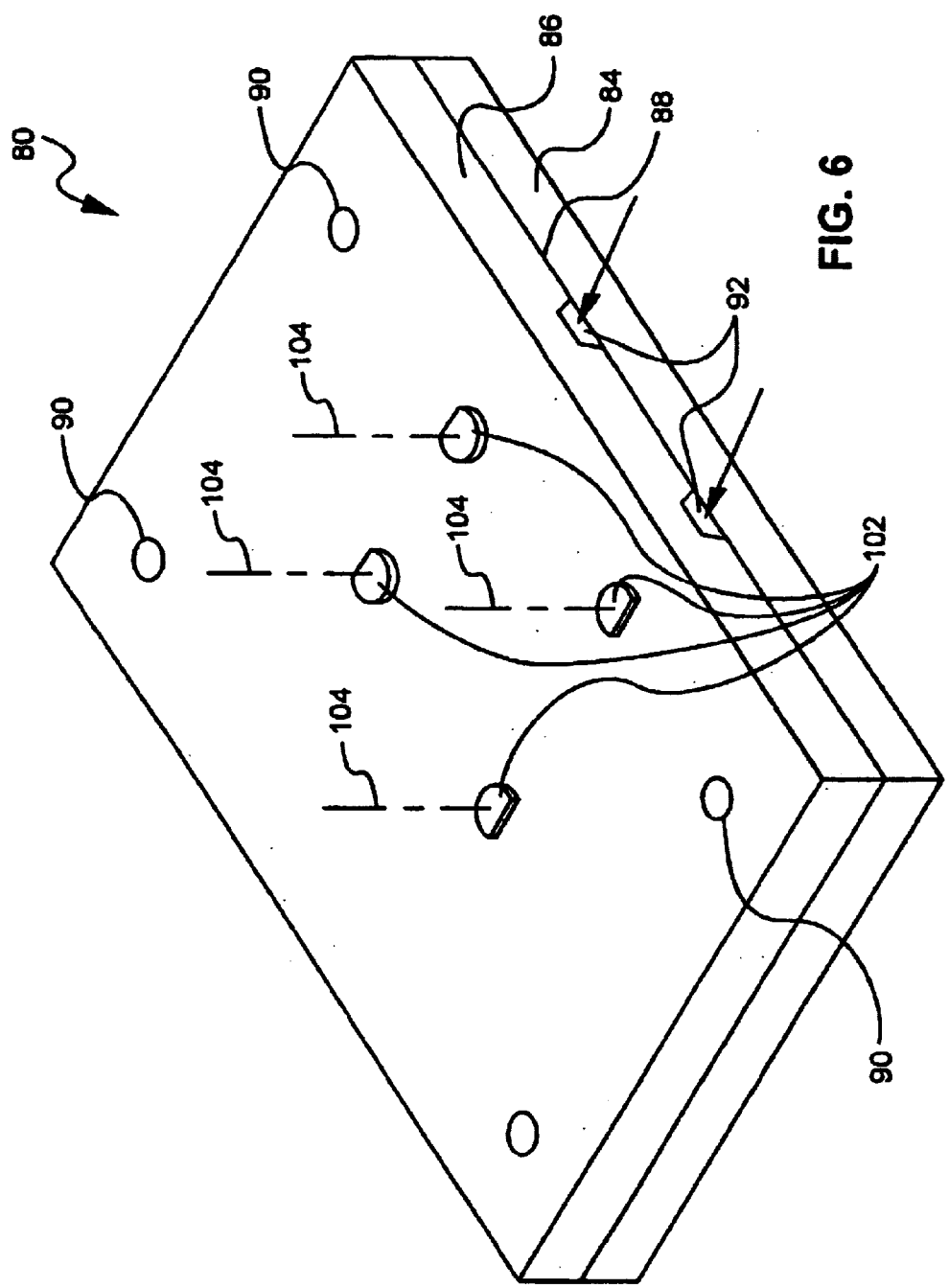
FIG. 6 is an enlarged isometric view of a molding apparatus for forming a semiconductor card in accordance with the invention.

Regardless of the particular application to which the card circuit is directed, semiconductor card 10 of the invention includes a plastic body 14 which is molded directly to the circuit side 62 of substrate 12, covering semiconductor element(s) 16, electrical component(s) 74 and exposed conductors, bond pads, etc., which are mounted thereon. As shown in FIG. 6, the molding apparatus 80 is of a type generally characterized as a transfer mold with mating first (e.g., lower) plate 84 and second (e.g., upper) plate 86 with an interface 88 intermediate the two plates. As known in the art, such molding apparatus 80 will include an internal mold cavity 100 having internal surfaces 160A, 160B in the lower plate 84 and upper plate 86, respectively (see FIGS. 7 and 10), and alignment apertures 90 for precise joining of the plates. In addition, there are openings 92 for introduction of flowable polymeric molding compound (not shown) into the mold cavity 100. In addition, the molding apparatus 80 is modified in accordance with the invention to include a plurality of down-set pins 102 (see FIGS. 11–13, and 18), which may be inserted downward along axes 104 in down-set pin holes 106 passing through the upper plate 86, as explained further below.

Furthermore, the molding apparatus 80 is modified to form wings 148 (see FIG. 21) of molded plastic material; the wings 148 extend laterally from areas between the rounded or drafted longitudinal edges 40, 42 along portions of the card's peripheral edge 36. Following extraction from the molding apparatus 80, the wings 148 are excised by a smooth cut about the card's peripheral edge 36, providing a semiconductor card 10 with very little if any flash material, and with generally smooth longitudinal edges 40 and 42.

Figure 7:
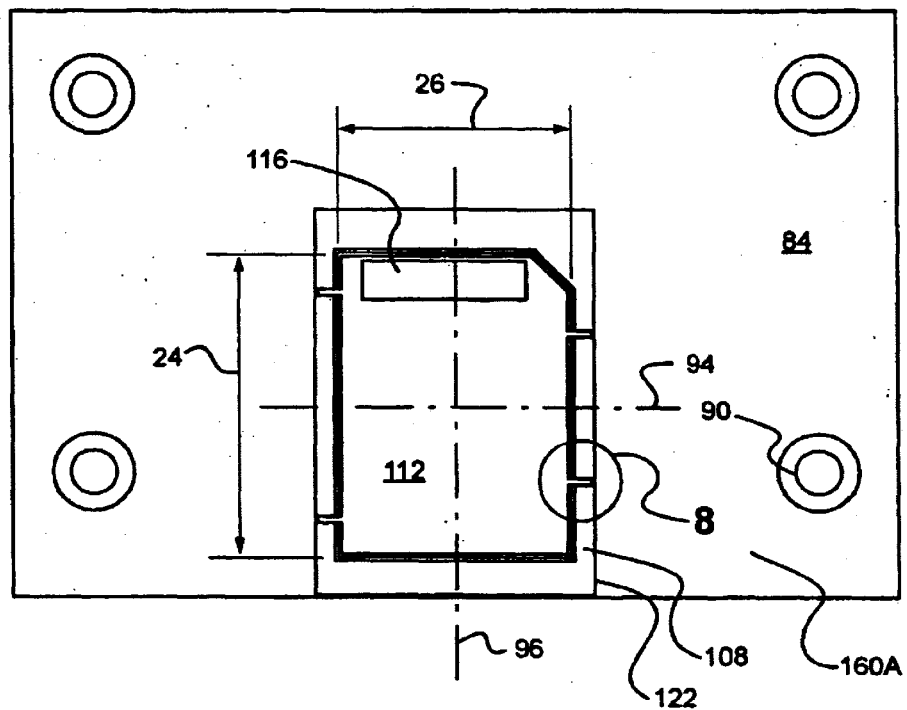
FIG. 7 is an enlarged plan view of a lower plate of a molding apparatus for forming a semiconductor card in accordance with the invention.
Figure 8:
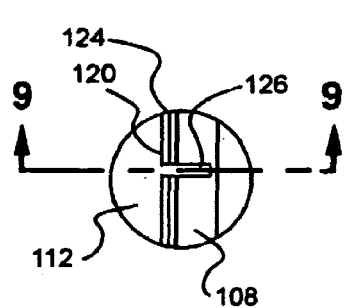
FIG. 8 is a further enlarged plan view of a lower plate of a molding apparatus of the invention, as taken from portion 8 of FIG. 7.
Figure 9:
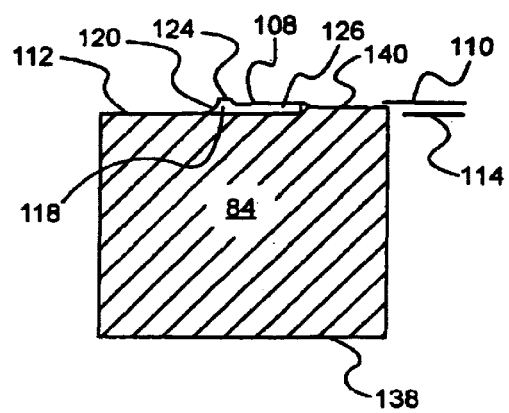
FIG. 9 is a cross-sectional side view of a portion of a lower plate of a molding apparatus of the invention, as taken along line 9—9 of FIG. 8.
Figure 13:
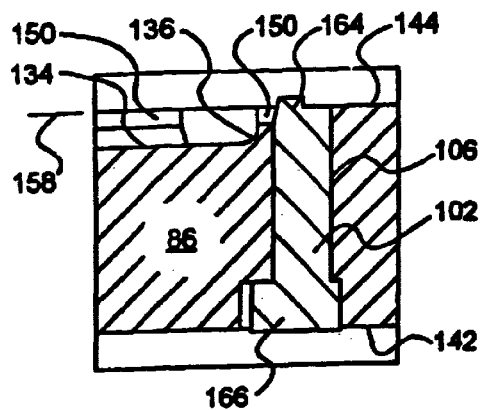
FIG. 13 is a cross-sectional side view of a portion of an upper plate of the invention, with an inserted down-set pin, as taken along line 12—12 of FIG. 11.
Figure 14:
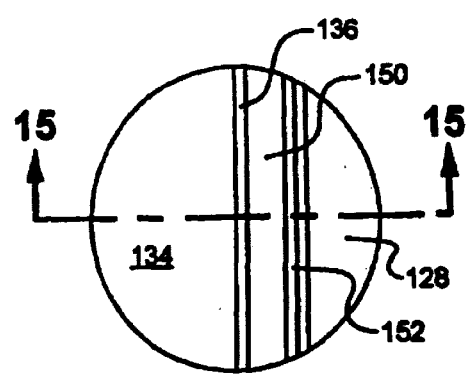
FIG. 14 is a further enlarged plan view of the lower side of an upper plate of a molding apparatus of the invention, as taken from portion 14 of FIG. 10.
Figure 15:
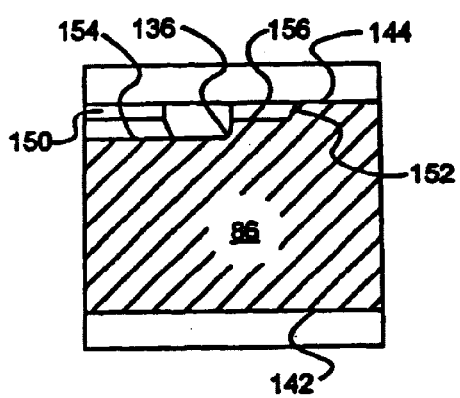
FIG. 15 is a cross-sectional side view of a portion of an upper plate of the invention, as taken along line 15—15 of FIG. 14.

Turning now to FIGS. 7 through 9, which show the first (lower) plate 84 of a representative molding apparatus 80 for forming a semiconductor card 10 from a substrate 12. The first plate 84 has an upper side 140 with an internal surface 160A, and a lower side or base 138. The first plate 84 includes a peripheral raised portion 108 to hold a module frame 46 at a first level 110. The outer edge 122 of peripheral raised portion 108 may be dimensionally smaller than the module 48. A depressed portion 112 laterally inside of the peripheral raised portion 108 is configured to accept a substrate 12 at lower level 114, with space for forming a plastic periphery about the substrate. The substrate is connected to the frame 46 by connecting segments 56. Portions 116 of the depressed portion 112 may be depressed further to accommodate external contacts 18 protruding from the opposing back side 64 of the substrate 12. Laterally intermediate the peripheral raised portion 108 and the depressed portion 112 is a lower edge portion 118 of the lower plate 84. The lower edge portion 118 has an inner arcuate surface 120 for forming rounded corners 38 and rounded longitudinal edges 40, 42 on the semiconductor card 10. The lower edge portion 118 passes upward through the peripheral opening 54 of the module 48, and in some locations, its upper surface 124 generally abuts the upper plate 86 to form a flash free seam on the peripheral edge 36 of the semiconductor card 10. As shown, a plurality of slits 126 is formed through the lower edge portion 118 and peripheral raised portion 108 for passage of connecting segments 56 of the module 48 therethrough. The numbers and locations of the plurality of slits 126 (and matching connecting segments 56) provide for downwardly motivated support of the substrate 12 in the depressed portion 112.

FIGS. 10 through 17 illustrate an upper plate 86 configured to contact the circuit side 62 of the substrate 12. The upper plate 86 has an upper side 142 and a lower side 144. The upper plate 86 is inverted in the figures for viewing the internal mold cavity 100 with an internal surface 160B in the lower side 144. Shown are alignment apertures 90, a raised peripheral portion 128 (with boundary 132) for contacting the upper surface 47 of frame 46, and injection ports 130 along plate edge 162, through which pressurized fluid polymer 15 is introduced into the mold cavity (see FIGS. 16 and 17). References to portions of the second, i.e., upper plate 86 as being "raised" or "depressed" refer to the plate as in the inverted position, i.e., with the lower side 144 facing up, and the upper side 142 facing downward. This is particularly evident in the sectional views in FIGS. 12, 13, 15 and 17.

The mold cavity 100 includes a central depressed region 134 defined by arcuate or drafted walls 136. In addition, outward cavity extensions or "wing cavities" 150 are shown on four sides of the central depressed region 134. Each wing cavity 150 has an outer sloped or rounded wall 152 for ease of mold release. Thus, the central depressed region 134 is at a level 154 below the level 158 of lower side 144. A step 146 upward from central depressed region 134 attains an intermediate level 156 forming the base of each wing cavity 150.

Figure 16:
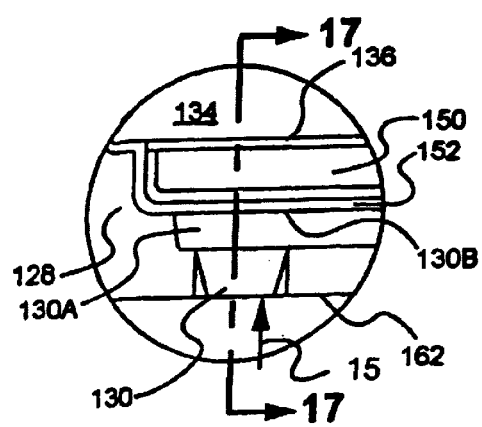
FIG. 16 is a further enlarged plan view of the lower side of an upper plate of a molding apparatus of the invention, as taken from portion 16 of FIG. 10.
Figure 17:
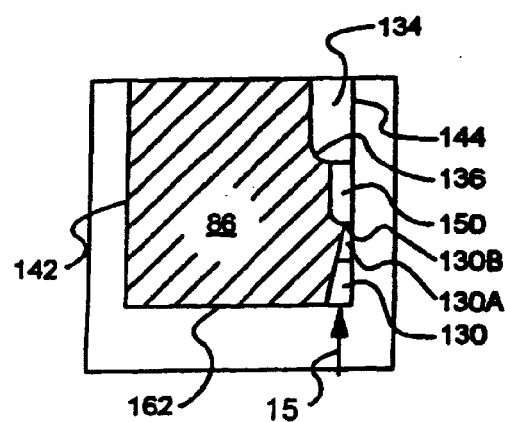
FIG. 17 is a cross-sectional side view of a portion of an upper plate of the invention, as taken along line 17—17 of FIG. 16.

As shown in FIGS. 16 and 17, each injection port 130 may communicate with a runner 130A and a gate 130B for introducing pressurized fluid polymer 15 into the mold cavity 100 at a controlled rate. The molding apparatus 80 may also include vents, not shown, for discharging air from the runners 130A and mold cavity 100, as known in the art.

Another feature of the upper plate 86 comprises a plurality of down-set pin holes 106, each located above a connecting segment 56. See FIGS. 10, 11, 12 and 13. A down-set pin 102 may be inserted in each down-set pin hole 106 to motivate the connecting segments 56 and attached substrate 12 downward into and against the depressed portion 112. Entry of liquid polymer to the back face 22 of the substrate 12 is thus prevented.

The down-set holes 106 and down-set pins 102 are positioned entirely within the wing cavities 150, outside of the peripheral edge 36 of the semiconductor card 10. The down-set pin 102 is shown as being generally cylindrical with an outer end 166 and an inner end 164 (see FIG. 13) which may be of reduced size. In the figures, the inner end 164 is shown as having a hemispherical shape with chamfered edges, but any shape which effectively clamps a connecting segment 56 against the depressed portion 112 may be utilized. For example, the inner end 164 may be square, rectangular, quarter round, lunate, etc. The down-set pin holes 106 and down-set pins 102 are preferably configured so that the inserted down-set pins 102 are always in the same position relative to the substrate 12. As shown herein, the configuration of the molding apparatus 80 and the configuration of module 48 must be compatible.

Figure 18:
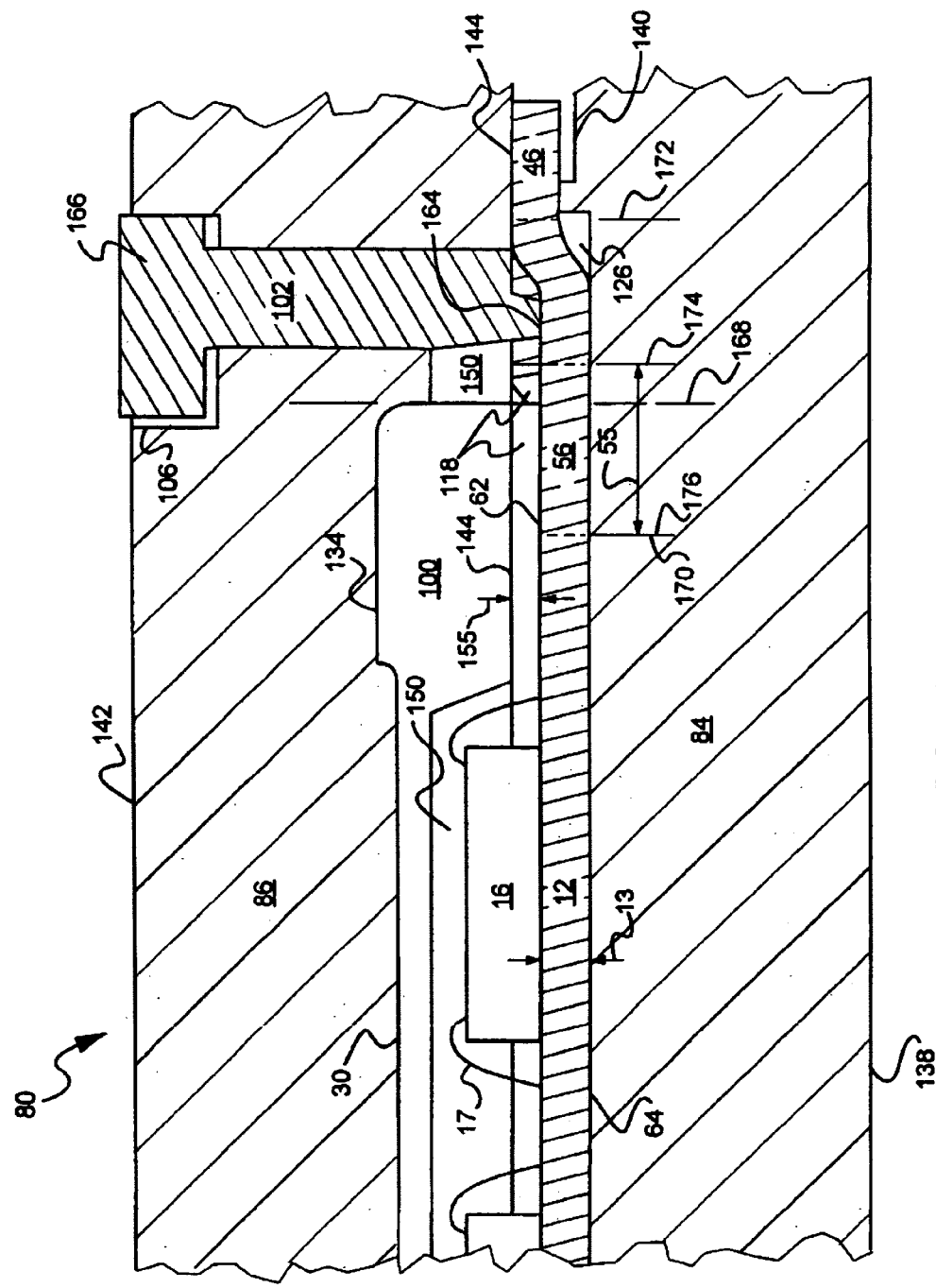
FIG. 18 is an enlarged partial cross-sectional end view of a molding apparatus of the invention illustrating a configuration of the molding cavity for fabrication of a plastic body on a substrate.
Figure 19:
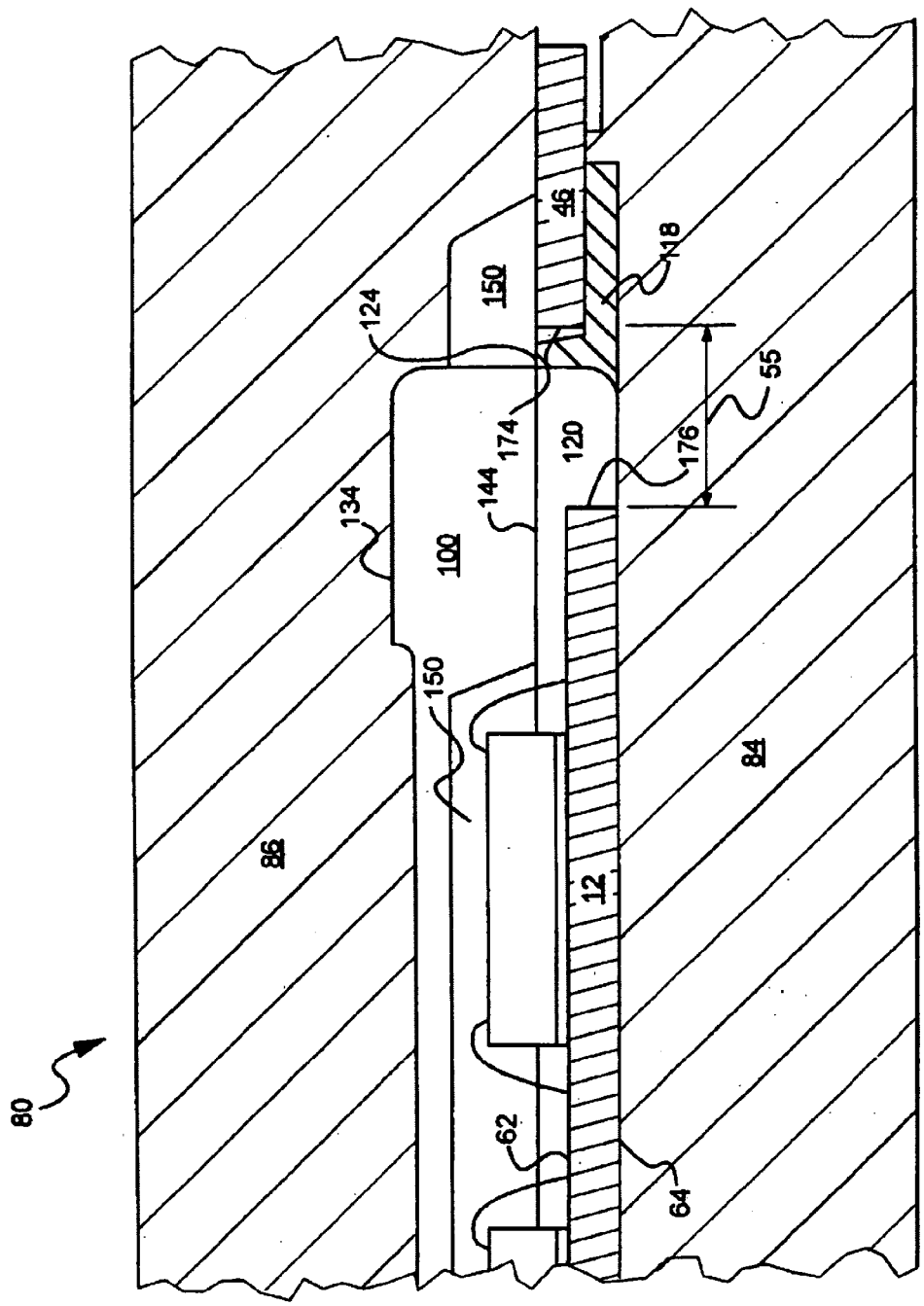
FIG. 19 is an enlarged partial cross-sectional end view of a molding apparatus of the invention illustrating a configuration of the molding cavity for fabrication of a plastic body on a substrate.
Figure 20:
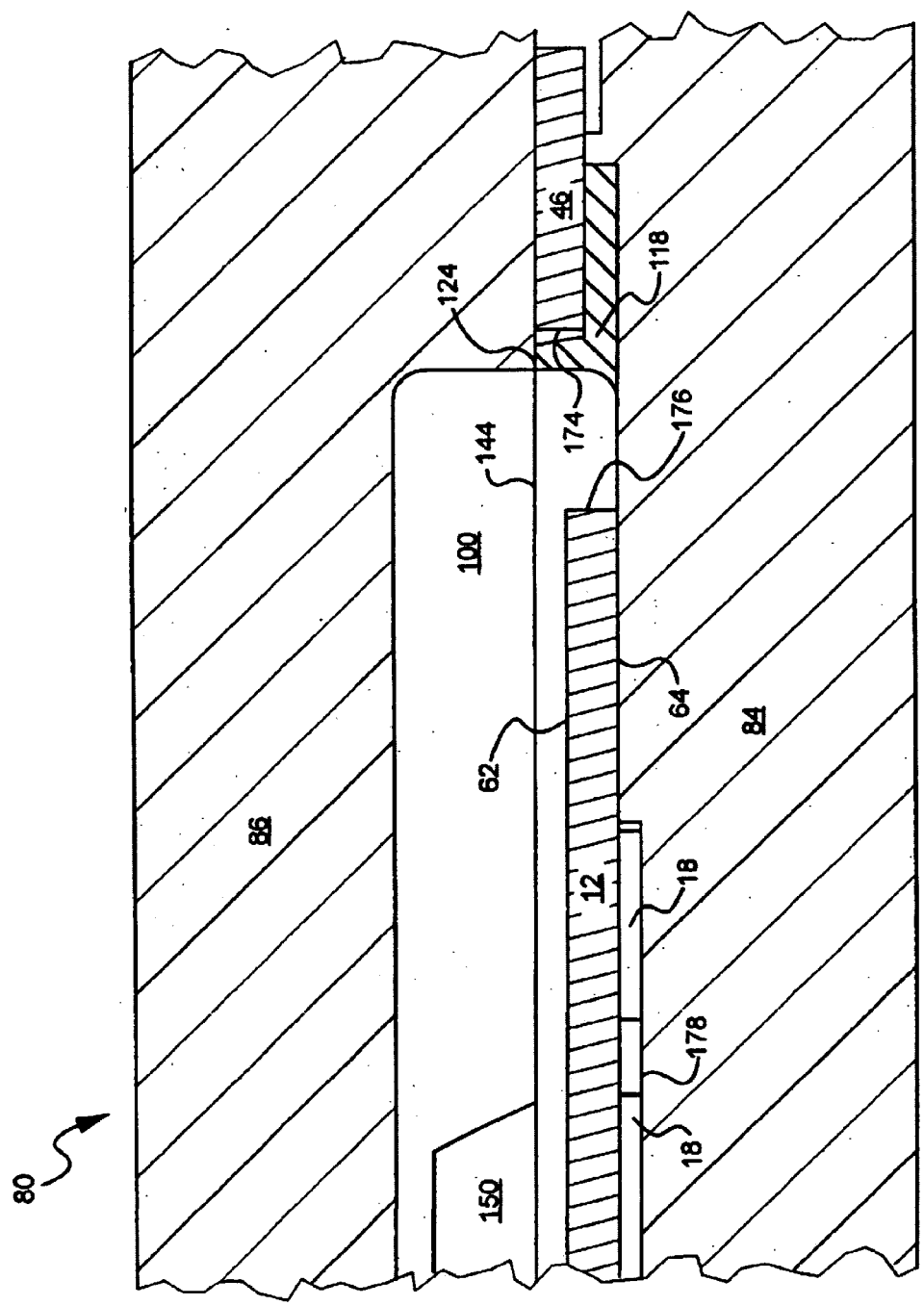
FIG. 20 is an enlarged partial cross-sectional end view of a molding apparatus of the invention illustrating a configuration of the molding cavity for fabrication of a plastic body on a substrate.

FIGS. 18, 19 and 20 show portions of a molding apparatus 80 assembled for forming an encapsulating plastic body 14 on a substrate 12 of a module 48. The dimensions of various parts are not necessarily to scale.

In FIG. 18, a module 48 is shown inserted between the upper side 140 of a first or lower plate 84 and the lower side 144 of a second or upper plate 86. The module section is shown with a frame 46, a substrate 12, and one of the four connecting segments 56 linking the substrate to the frame. The connecting segment 56 has an inner end 170 and an outer end 172. The connecting segment 56 is shown pushed downward by the inner end 164 of one of the down-set pins 102 into the depressed portion 112 of the lower plate 84. The displacement 155 of the substrate 12 from the frame 46 may be small, i.e., about ⅕ of the substrate thickness 13, or may be up to about three times the substrate thickness 13, depending on the thicknesses of substrate and semiconductor card 10.

The substrate 12 is shown with a circuit side 62 on which are mounted exemplary semiconductor elements 16 with connecting bond wires 17. The substrate 12 is held downward to depressed portion 112 (not shown) by the connecting segments 56, generally preventing passage of pressurized fluid polymer 15 (not shown) onto the substrate's opposing back side 64. For reference purposes, the peripheral opening 54 over the majority of the substrate 12 generally has a width 55 extending from the inner end 170 to the opening's outer edge 174 (see also FIGS. 19 and 20).

In FIG. 18, the central depressed region 134 forming the front face of the molded semiconductor card 10 is shown with a slightly indented label area 30 in which a label may be applied. In addition, FIG. 18 depicts a final singulation plane 168 relative to the molding apparatus 80. The semiconductor card 10 will be singulated from the frame 46 and wings 148 following removal from the molding apparatus 80.

Following molding and solidification of the casting in the molding apparatus 80, the unsingulated semiconductor card 10 may be ejected from the mold by further insertion of down-set pins 102, or use of other pins, not shown. Ease of ejection is enabled by the use of sloped lateral surfaces and rounded or oblique corners on the molded casting 180.

FIG. 19 depicts the molding apparatus 80 with the module frame 46 and substrate 12 at a position away from a connecting segment 56. Shown are wing cavities 150 in which wings 148 are formed. The lower edge portion 118, which surrounds the mold cavity 100 in the lower plate 84, fits within the peripheral opening 54 between edges 174 and 176. The lower edge portion 118 molds an inner arcuate surface 120 on the molded semiconductor card 10.

FIG. 20 depicts the molding apparatus 80, substrate 12 and module frame 46 in a portion where there is a substantial absence of wing cavities 150, and the substrate has external contacts 18 on its opposing back side 64. As shown, a cavity 178 is formed in the lower plate 84 into which the external contacts 18 fit. The external contacts 18, or even the entire opposing back side 64, may in addition be covered by tape or other protective member (not shown) to ensure freedom from flash material on the card's back side.

Figure 21:
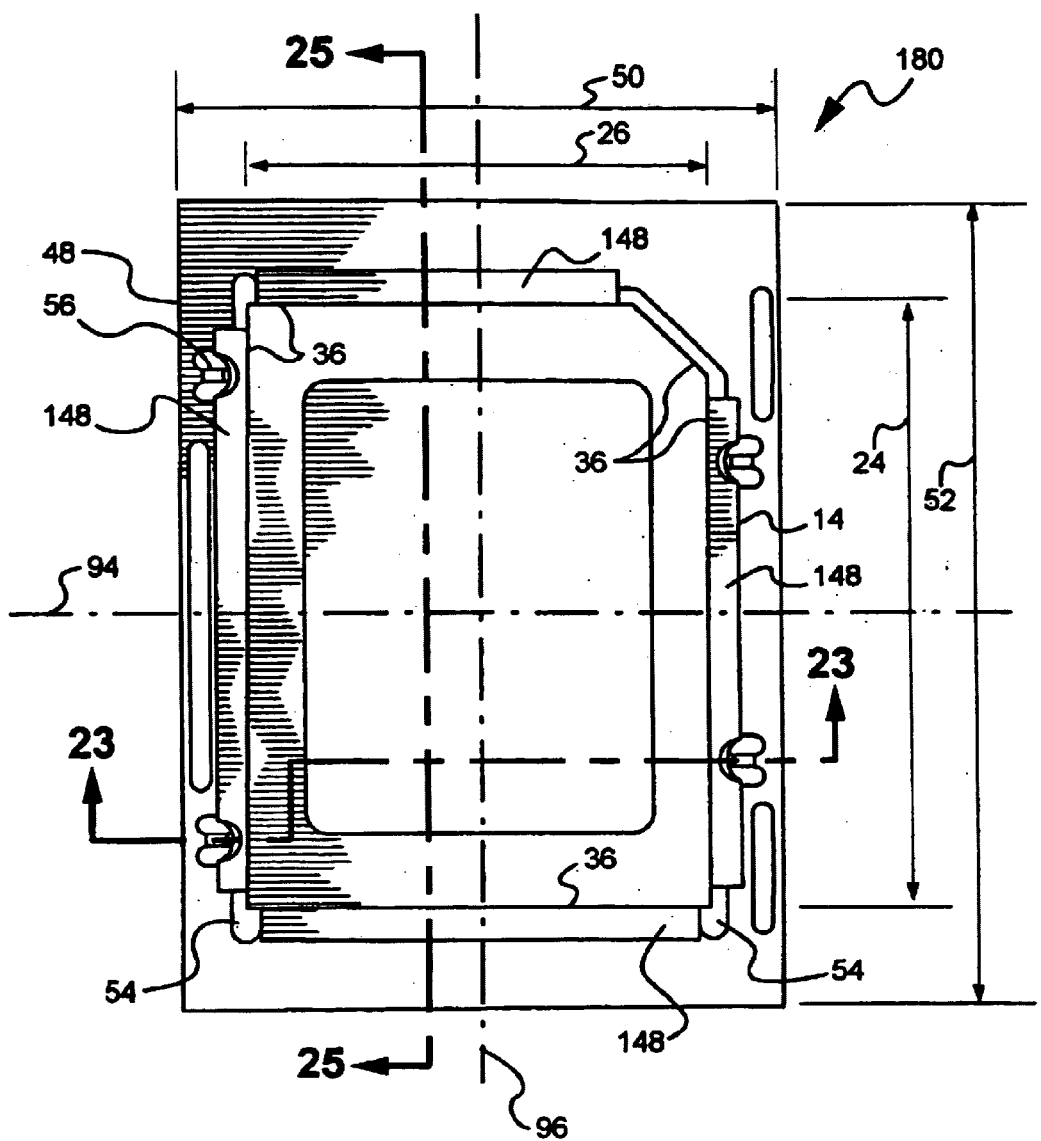
FIG. 21 is an enlarged plan view of a mold casting of the semiconductor card and attached frame of the invention, prior to singulation.
Figure 22:
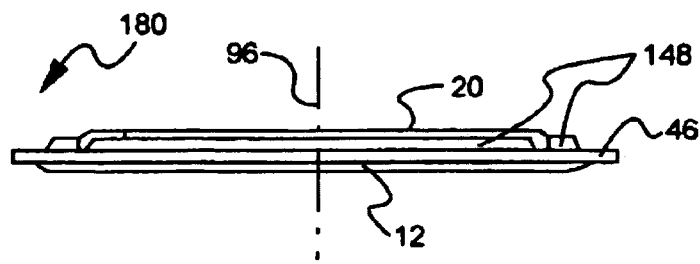
FIG. 22 is an enlarged lower end view of a molded semiconductor card and attached frame of the invention, prior to singulation.
Figure 23:
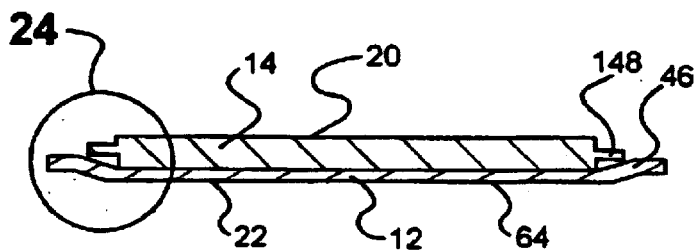
FIG. 23 is an enlarged cross-sectional end view of a molded semiconductor card and attached frame of the invention, prior to singulation, as taken along section line 23—23 of FIG. 21.
Figure 25:
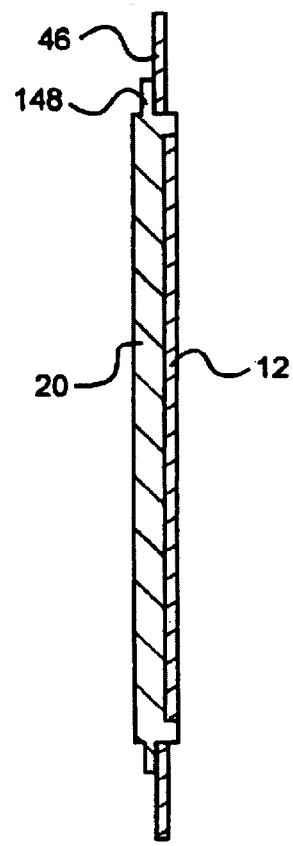
FIG. 25 is an enlarged cross-sectional side view of a molded semiconductor card and attached frame of the invention, prior to singulation, as taken along section line 25—25 of FIG. 21.
Figure 24:
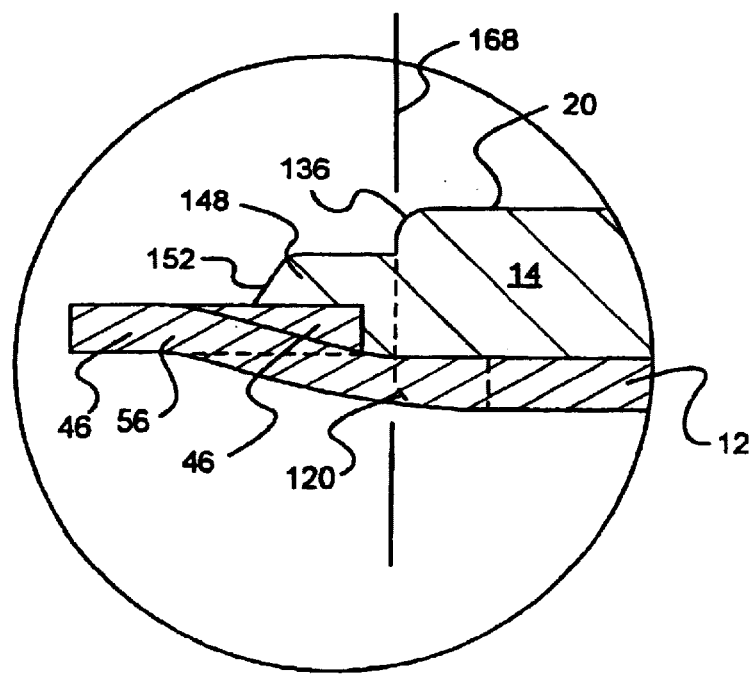
FIG. 24 is an enlargement of portion 24 of FIG. 23.

In FIG. 21, a molding casting 180 molded on a semiconductor card module 48 is shown in front view following removal from the molding apparatus 80. The card module 48 includes a plastic body 14 with molded wings 148 extending outwardly therefrom along major peripheral edges 36. The plastic body 14 has a width 26 and length 24. The peripheral openings 54 are now filled with pressurized fluid polymer 15, including on both sides of each connecting segment 56. The plastic body 14 is connected to the module 48 along a central portion of its peripheral edges 36, and its upper and longitudinal edges 40, 42 are smooth, rounded or oblique, and substantially free of flash material. This is evident by examination of FIGS. 22, 23, 24 and 25. The semiconductor card 10 has a back face 22 comprising the opposing back side 64 of the substrate 12. The semiconductor card 10 is singulated from the module 48 by cutting it free along its peripheral edges 36, i.e., through the wings 148, by saw, erosion process or other cutting tool. The four small exposed ends 56A of the connecting segments 56 (see FIG. 1), which project from connecting segments 56 may be easily trimmed (if desired) by clipping or other methods. Alternatively, the exposed ends 56A may be pre-scored, i.e., prior to molding, to minimize protrusion of the exposed ends 56A from the connecting segments 56.

In the manufacture of the semiconductor card 10 of the invention, the steps involved may be summarized as including:

a. A strip 44 of a dielectric material is provided in sheet form;

b. A peripheral opening 54 is formed in at least one portion of the strip 44 designated as a module 48, in which the peripheral opening 54 defines the boundaries of a substrate 12. Opposing sides of the substrate 12 are connected to a frame 46 of the module 48 by connecting segments 56 of the module 48. Other openings 82 for indexing and handling are also provided.

c. A circuit is formed on the "circuit" side 62 of the substrate 12, including at least one semiconductor element 16, as well as electrical component(s) 74 and interconnecting conductors.

d. External contacts 18 are formed on the opposing back side 64 of the substrate 12 and connected to the circuit.

e. A set of plates 84, 86 are configured for molding a plastic body 14 peripherally about the circuitized substrate 12 and over portions of the circuit side 62 thereof. Down-set pin holes 106 are provided outside of the card's peripheral outline 70 in an upper plate 86 for insertion of down-set pins 102 to motivate the connecting segments 56 (and attached substrate 12) downward to a lower level against a lower surface of the internal mold cavity 100 in the lower plate 84.

f. The lower plate 84 and upper plate 86 are assembled with module 48 therebetween. The molding apparatus 80 is connected to a supply of molding compound and clamped shut. Down-set pins 102 are positioned in the down-set pin holes 106 to force the substrate 12 downward to a seated position.

g. Pressurized fluid polymeric 15 is introduced into the molding apparatus 80 under conditions which rapidly fill the mold cavity 100, encapsulating the circuit and forming a plastic body 14.

h. After curing and cooling of the pressurized fluid polymer 15, the mold is opened and the molded module 48 removed therefrom. Pins may be inserted in down-set pin holes 106 and used as ejection tools for releasing the module.

i. The semiconductor card 10 is singulated from its module 48 by cutting along the card's peripheral outline 70.

j. If desired, exposed ends 56A of the connecting segments 56 within the semiconductor card 10 may be cut back. If necessary, flash residue may be removed.

In another embodiment of the invention, the molding apparatus 80 may be configured to cover portions of both faces 20, 22 of a substrate 12. The mold cavity 100 of lower plate 84 is varied by providing one or more additional cavities and associated runners for introducing pressurized fluid polymer 15.

As described herein, the invention provides a semiconductor card by a method that eliminates a separate glob top encapsulation step, and ensures smooth card edges which are rounded or oblique. Desired card dimensions are readily maintained, and flash material requiring removal is minimized. If desired, the molding assembly may be configured to form several cards simultaneously.

It is apparent to those skilled in the art that various changes and modifications may be made in the manufacturing methods and apparatus of the invention as disclosed herein without departing from the spirit and scope of the invention as defined in the following claims.

What is claimed is:

1. A method for fabricating a semiconductor card, comprising:

providing a strip comprising a module with a peripheral opening defining an internal substrate and an external frame, and a plurality of connecting segments connecting the substrate to the frame, the substrate comprising a circuit side having a circuit thereon and a back side having external contacts thereon;

mounting at least one semiconductor component to the circuit side in electrical communication with the external contacts;

installing the strip in a molding assembly having a molding cavity with internal surfaces in first and second mold plates and wherein the substrate is forcibly moved to a level differing from the level of the frame by movement of pins passing through down-set throughholes in the molding assembly to contact, move and clamp the connecting segments attached to the substrate;

molding a plastic body on the circuit side of the substrate, the body including edge portions of the card formed laterally outwardly from the substrate, and a plurality of wings extending laterally outwardly from the edge portions; and removing the molded casting from the molding assembly and singulating the card from the wings by excision.

2. The method in accordance with claim 1, wherein the substrate is moved to a level at which the back side thereof abuts a surface of the molding cavity.

3. The method in accordance with claim 1, wherein the substrate is moved a distance of about 0.2–3 times the substrate thickness.

4. The method in accordance with claim 1, wherein portions of the peripheral opening adjacent outer ends of the connecting segments are elongated laterally outward to lengthen the connecting segments.

5. The method in accordance with claim 1, wherein the frame is connected by connecting segments to the substrate on opposing edges thereof.

6. The method in accordance with claim 1, wherein the molding encapsulates the circuit side of the substrate and leaves the external contacts uncovered.

7. The method in accordance with claim 1, wherein the molded casting is removed from the molding assembly by inserting pins into the down-set throughholes to eject the molded casting thereby.

8. The method in accordance with claim 1, wherein the molded casting is removed from the molding assembly by further insertion of the down-set pins through the down-set throughholes to eject the molded casting thereby.

* * * * *

UNITED STATES PATENT AND TRADEMARK OFFICE
CERTIFICATE OF CORRECTION

| | |
|---|---|
| PATENT NO. | : 7,220,615 B2 |
| APPLICATION NO. | : 09/878302 |
| DATED | : May 22, 2007 |
| INVENTOR(S) | : Bolken |

It is certified that error appears in the above-identified patent and that said Letters Patent is hereby corrected as shown below:

On the face page, in field (74), in "Attorney, Agent, or Firm", in column 2, line 1, after "TraskBritt" delete ", PC".

Signed and Sealed this

Twenty Second Day of April, 2008

JON W. DUDAS
*Director of the United States Patent and Trademark Office*